United States Patent [19]

Spigarelli

[11] Patent Number: 4,821,393
[45] Date of Patent: Apr. 18, 1989

[54] COMPONENT CENTERING TOOL

[75] Inventor: Donald J. Spigarelli, Carlisle, Mass.
[73] Assignee: Srtechnologies, Inc., Concord, Mass.
[21] Appl. No.: 55,031
[22] Filed: May 28, 1987
[51] Int. Cl.$^4$ .......................... B23Q 3/00; H05K 3/30
[52] U.S. Cl. ........................ 29/283; 29/741; 29/759; 267/224; 267/242; 267/254 CS
[58] Field of Search ................ 29/740, 741, 759, 283; 74/89.15; 269/309, 242, 224, 254 CS; 414/28; 279/1 L

[56] References Cited

U.S. PATENT DOCUMENTS

| | | | |
|---|---|---|---|
| 2,881,645 | 4/1959 | Kruchten | 269/242 X |
| 4,174,847 | 11/1979 | Wiesler | 279/1 L |
| 4,255,077 | 3/1981 | Smith | 29/740 X |
| 4,448,406 | 5/1984 | Hullberg et al. | 269/242 X |

Primary Examiner—Carl E. Hall
Attorney, Agent, or Firm—Weingarten, Schurgin, Gagnebin & Hayes

[57] ABSTRACT

Apparatus especially useful for centering an electronic component on a surface for subsequent pickup and placement on a circuit board. The apparatus includes a pair of jaws which are driven in unison toward and away from each other by a lead screw or similar mechanism, each of the jaws having a part adapted to engage a respective side of a component to be positioned. The engagement part of each jaw is resiliently loaded such as by a spring or air cylinder and is in a normally outward position. The jaws are pre-aligned so that they drive in unison toward a predetermined center line. A component place between the jaws is contacted by the engagement parts of the jaws when the jaws move toward each other, and is moved into alignment on the center line. The jaws over-travel the aligned position against the spring pressure of the jaws, this spring pressure providing an intended over-travel force which prevents excessive force on the component by the engaged jaws. The over-travel also allows acceptance of a range of component sizes for the same jaw configuration.

13 Claims, 1 Drawing Sheet

COMPONENT CENTERING TOOL

FIELD OF THE INVENTION

This invention relates to apparatus for the centering of components and more particularly to apparatus for centering an electronic or other component at an intended position on a surface.

BACKGROUND OF THE INVENTION

In the automatic assembly of printed circuit boards it is usually required that components be located at intended positions on the board for soldering or other attachment to the board. In automatic assembly machines of known construction, often called pick and place systems, a pickup head includes centering apertures into which a component is inserted for placement at intended positions on a circuit board. The component in this type of head is centered by its installation in an aperture of the pickup head which is in a known position. Other pickup heads include calipers for aligning a component and transferring the aligned component to the board surface.

SUMMARY OF THE INVENTION

In brief, the present invention provides apparatus especially useful for centering an electronic component on a surface for subsequent pickup and placement on a circuit board. The apparatus includes a pair of jaws which are driven in unison toward and away from each other by a lead screw or similar mechanism, each of the jaws having a part adapted to engage a side of a component to be positioned. The engagement part of each jaw is resiliently loaded such as by a spring or air cylinder and is in a normally outward position. The jaws are pre-aligned so that they drive in unison toward a predetermined center line. A component placed between the jaws is contacted by the engagement parts of the jaws when the jaws move toward each other, and is moved into alignment on the center line. The jaws over-travel the aligned position against the spring pressure of the jaws, this spring pressure providing an intended over-travel force, which prevents excessive force on the component by the engaged jaws. The over-travel also allows acceptance of a range of component sizes for the same jaw configuration.

To achieve alignment along a center line orthogonal to the first center line, a second pair of similarly constructed jaws can be disposed along the orthogonal axis. Or, a single pair of jaws can be rotated or indexed 90 degrees to provide the transverse alignment.

The centering apparatus can include a vacuum holddown which has a vacuum probe coupled to a bellows such that when vacuum is applied after the probe engages the surface of a component, the bellows contracts to apply a downward force on the component to retain the component in position on a surface after centering.

DESCRIPTION OF THE DRAWINGS

The invention will be more fully understood from the following detailed description taken in conjunction with the accompanying drawings in which.

DETAILED DESCRIPTION OF THE INVENTION

Figure 1:
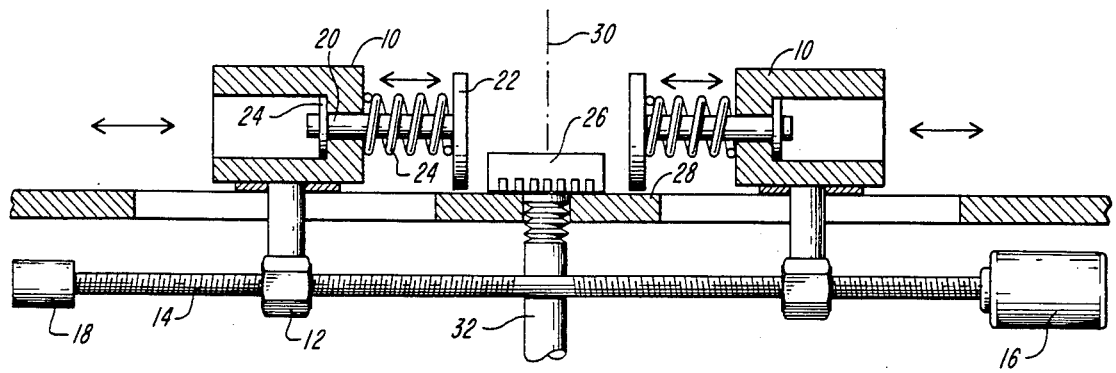
FIG. 1 is a sectional elevation view of centering apparatus in accordance with the invention.
Figure 2:
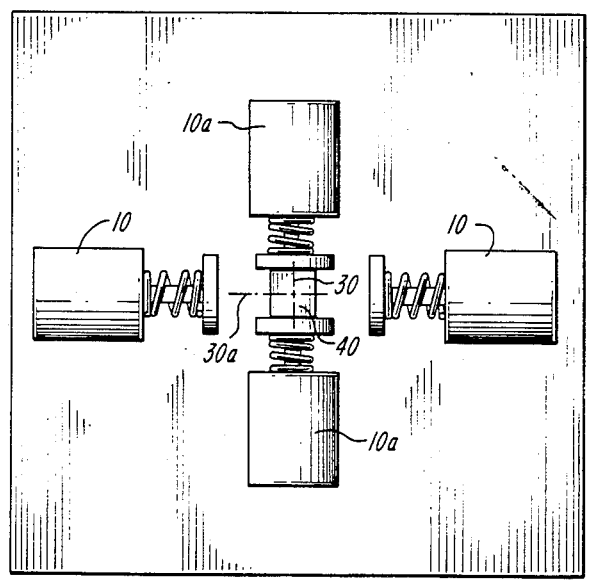
FIG. 2 is a cutaway sectional elevation view showing the jaws engaging a component after centering.
Figure 3:
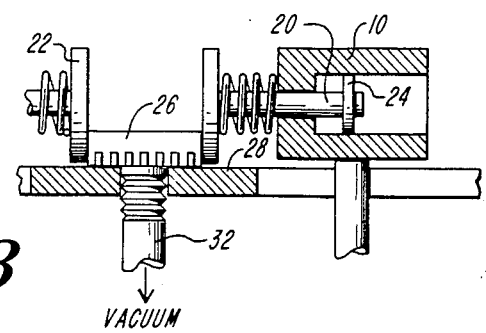
FIG. 3 is a top view of centering apparatus according to the invention for providing alignment along mutually transverse axes.

Referring to FIGS. 1 and 2, apparatus for centering an electronic component on a surface is shown and comprises first and second jaws 10, each of which is coupled via a nut 12 to a lead screw 14 which is attached at one end to a motor 16 and at the other end to a support bearing 18. The nuts 12 are oppositely threaded such that upon rotation of the lead screw, the nuts and the jaws attached thereto are driven in unison toward or away from each other in accordance with the direction of rotation of the lead screw. Each of the jaws includes a shaft 20 slidable on the jaw and outwardly extending from the jaw. Each shaft has a plate 22 attached thereto with a spring 24 disposed between the inner surface of plate 22 and confronting surface of jaw 10 and operative to maintain the plate 22 in an outward position against the urging of the spring. The shaft 20 is retained on the jaw such as by a washer 24. The plates 22 are disposed and configured to engage respective opposite sides of an electronic component 26 placed between the jaws on the surface 28. In the illustrated implementation, the plate 22 are shown of rectangular configuration. The plates can be of any intended shape to accommodate the component to be aligned.

In operation, with the jaws in their outward position, a component 26 is placed on surface 28 between the jaws, and the lead screw is driven to cause inward movement of the jaws 10. One of the jaws will engage the component and push the component toward the center line. The jaws continue to be driven to a position at which both plates 22 engage respective sides of the component 26. The component 26 is thus centered along the center line 30 on the surface 28. The jaws 10 are driven beyond the point of engagement of plates 22 with the component against the urging of springs 24 (FIG. 2). The engagement force of the jaws therefore cannot exceed the force provided by the springs. The spring force is sufficient to move the engaged component to the center line, and is less than the force sufficient to damage the component. The over-travel also permits a range of component sizes to be centered with the same apparatus due to the range of over-travel provided by the permissible movement of the plates 22 in relation to the respective jaws 10.

The component can be maintained at its centered position on surface 28 by a vacuum probe 32 which includes a bellows 34 near the probe end which engages a surface of component 26. The vacuum probe is attached to a suitable source of negative pressure. After the component is centered by the jaws 10, vacuum is applied to the probe 32 to cause the bellows to contract and cause a downward force on the component onto the surface 28 The component is thereby retained at its centered position, and the jaws 10 can be retracted by reverse operation of the lead screw.

The centering apparatus of FIG. 1 can be mounted on a rotatable or indexable table for ninety degree rotation by which centering can be accomplished on an axis orthogonal to axis 30. Alternatively, a pair of cooperative jaws can be arranged as shown in FIG. 2 to provide for centering along mutually orthogonal axes. As seen in FIG. 2, a pair of jaws 10 provides centering along a first axis 30 as described above. A second pair of jaws 10a, which can be identical to the jaws and associated components described above, is disposed along an orthogonal axis 30a and provides centering of a component along the axis 30a, thereby centering a component 40 along these mutually perpendicular axes.

Typically, the jaws are driven a fixed distance during each operating cycle, this distance being determined to accommodate the intended range of component sizes to be handled. The spring force is greater for larger component sizes, since the jaws travel a greater over-travel distance against the spring action, than for smaller size components. The overall spring force is selected to be less than that which could cause component damage. Also, the spring force for each component lead tends to be approximately the same over a range of component sizes, since larger components usually have more leads per side than smaller components.

It is contemplated that propulsion mechanisms other than a lead screw can be employed for movement of the jaws 10. Also, the jaws can be of many different implementations to suit particular requirements. Accordingly, the invention is not to be limited by what has been particularly shown and described except as indicated in the appended claims.

I claim:

1. Apparatus for centering a component on a surface comprising:
   first and second jaws disposed in close proximity to the surface and each having an element for engaging a side of a component, and resilient coupling means for biasing the element in a normally extended position;
   means coupled to the jaws and operative to selectively move the jaws in unison toward each other and away from each other;
   the jaws being operative during movement toward each other to engage a component disposed on the surface between the jaws and to slide the component along the surface into alignment on a center line between the jaws;
   the jaws being driven beyond the point of engagement between the elements and the component against the urging of the resilient coupling means, and
   means separate from the jaws for retaining the component at its aligned position on the surface after centering by said jaws.

2. The apparatus of claim 1 wherein the means coupled to the jaws includes:
   a lead screw drive;
   first and second nuts each coupled to the lead screw and to a respective jaw;
   the lead screw and nuts being operative during rotation of the lead screw in one direction to move the jaws in unison toward each other, and upon rotation in the opposite direction to move the jaws in unison away from each other.

3. Apparatus according to claim 1 wherein the resilient coupling means includes a spring disposed between a portion of the jaw and said element for urging the element to a normally outward position, the element being moveable toward the jaw upon engagement with the component to provide a predetermined spring force on the component.

4. Apparatus according to claim 1 further including means for retaining the component at its aligned position on the surface after centering by said jaws.

5. Apparatus according to claim 4 wherein said retaining means includes a vacuum probe including a bellows therein and a probe end which engages a surface of a component on the surface;
   the probe being operative upon application of vacuum thereto to cause the bellows to contract and force the component onto the surface.

6. Apparatus according to claim 1 wherein the jaws and moving means can be rotated to an orthogonal position to provide centering of a component upon an axis orthogonal to the original axis.

7. Apparatus according to claim 1 wherein each of the jaws includes a shaft slidable on the jaw and outwardly extending from the jaw, each shaft having a plate attached thereto with a spring disposed between the plate and confronting surface of the jaw and operative to maintain the plate in an outward position against the urging of the spring.

8. Apparatus according to claim 1 including:
   third and fourth jaws disposed in association with the surface and operative like the first and second jaws but along an axis orthogonal to the travel axis of the first and second jaws.

9. Apparatus for centering and retaining a component on a surface, comprising:
   a pair of opposing jaws, each jaw comprising;
      a single shaft slideably mounted on, and outwardly extending from said jaw;
      a plate attached to one end of said shaft, and
      biasing means disposed between said plate and said jaw and operative to urge said plate outwardly from said jaw;
   a lead screw drive;
   a respective nut connected to each jaw and coupled to said lead screw;
   said lead screw and nuts being operative during rotation of said lead screw in one direction to move said jaws in unison toward each other, and upon rotation in the opposite direction to move said jaws away from each other;
   said jaws being operative during movement toward each other to engage a component disposed on the surface between said jaws and to slide the component along the surface into alignment on a center line between said jaws; and
   retaining means other than said jaws for retaining the component in its aligned position, including a vacuum probe which engages a surface of the aligned component.

10. Apparatus according to claim 9 wherein said biasing means comprises spring means peripherally mounted on said shaft.

11. Apparatus according to claim 9 wherein said jaws, lead screw and nut can be rotated to an orthogonal position to provide centering of the component upon an axis orthogonal to the original axis.

12. Apparatus according to claim 9 further including:
   a second pair of opposing jaws operative along an axis orthogonal to the travel axis of said first pair of opposing jaws, each jaw comprising:
      a single shaft slideably mounted on, and outwardly extending from said jaw;
      a plate attached to one end of said shaft, and
      biasing means disposed between said plate and said jaw and operative to urge said plate outwardly from said jaw;
   a second lead screw drive;

a respective nut connected to each jaw of said second pair of opposing jaws and coupled to said second lead screw;

said second lead screw and nuts being operative during rotation of said second lead screw in one direction to move said second pair of opposing jaws in unison toward each other, and upon rotation in the opposite direction to move said second pair of opposing jaws away from each other, and said second pair of opposing jaws being operative during movement toward each other to engage a component disposed on the surface between said second pair of opposing jaws and to slide the component along the surface into alignment on a center line between said second pair of opposing jaws.

13. Apparatus of claim 9 wherein said retaining means further includes a bellows and a probe end;

the probe end operative upon application of a vacuum thereto to cause the bellows to contract and force the component onto the surface.

* * * * *